United States Patent
Kakuta et al.

[11] Patent Number: 6,028,487
[45] Date of Patent: *Feb. 22, 2000

[54] NEGATIVE-FEEDBACK AMPLIFIER CIRCUIT CAPABLE OF INDEPENDENTLY CONTROLLING A GAIN AND AN IMPEDANCE

[75] Inventors: Yuji Kakuta; Yasuhiro Shirakawa; Yoshiaki Fukasawa; Yoshiaki Wakabayashi, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/939,879

[22] Filed: Sep. 29, 1997

[30] Foreign Application Priority Data

Sep. 30, 1996 [JP] Japan ................................. 8-258103

[51] Int. Cl.⁷ ................................ H03F 1/22; H03F 1/34
[52] U.S. Cl. ........................... 330/311; 330/99; 330/100
[58] Field of Search .................................. 330/70, 71, 86, 330/98, 99, 100, 277, 282, 293, 311

[56] References Cited

U.S. PATENT DOCUMENTS 3,707,685  12/1972  Geffe ..................................... 330/99 X
3,733,514   5/1973  Garuts .
4,453,132   6/1984  Stanler ............................... 330/100 X
4,940,949   7/1990  Landi ................................. 330/311 X
5,015,968   5/1991  Podell et al. ............................ 330/277
5,049,835   9/1991  Vasile ................................. 330/311 X
5,144,266   9/1992  Dougherty et al. ................. 330/311 X
5,376,899  12/1994  Pass .

FOREIGN PATENT DOCUMENTS 3-52407   3/1991  Japan .
7-183735  7/1995  Japan .

OTHER PUBLICATIONS

R. Jindal—Gigahertz–Band High–Gain Low–Noise AGC Amplifiers in Fine–Line NMOS; IEEE Journal of Solid–State Circuit, vol. SC–22, No.4, Aug. 1987; pp 512–521.

Primary Examiner—Steven J. Mottola
Attorney, Agent, or Firm—Whitham, Curtis & Whitham

[57] ABSTRACT

A plurality of field effect transistors (FET's) (11, 12) are coupled in cascode connection. A drain of the final-stage FET (12) is coupled to a gate of the first-stage FET (11) through a first negative-feedback circuit (13). A drain of the first-stage FET (11) is coupled to the gate of the first-stage FET (11) through a second negative-feedback circuit (14). The first negative-feedback circuit (13) is connected to a first resistor (Rf1) while the second negative-feedback circuit (14) is connected to a second resistor (Rf2).

9 Claims, 2 Drawing Sheets

NEGATIVE-FEEDBACK AMPLIFIER CIRCUIT CAPABLE OF INDEPENDENTLY CONTROLLING A GAIN AND AN IMPEDANCE

BACKGROUND OF THE INVENTION

This invention relates to a negative-feedback amplifier circuit comprising a plurality of transistors in so-called cascode connection in the manner known in the art. The negative-feedback amplifier circuit is for amplifying an input electric signal into an output electric signal In cable television (CATV) systems or the like, trials have recently been made to accommodate an increased number of video signal channels as many as 100 or more. In order to cope with such a large number of video signal channels, it is required to provide a wide-band amplifier capable of amplifying a video signal over a wide band. Specifically, each video channel is generally required to have a bandwidth on the order of 6 MHz. Therefore, the wide-band amplifier is required to perform low-distortion and high-gain amplification over a wide band of at least 600 MHz. Preferably, the wide-band amplifier of the type is adapted to perform low-distortion amplification over a band as wide as 1 GHz, taking a future increase in number of channels into consideration.

For example, Japanese Unexamined Patent Publication (JP-A) No. 7-183735 (183735/1995) discloses one example of such an amplifier. This amplifier comprises a negative-feedback amplifier circuit which Includes a plurality of field effect transistors (FET's) in so-called cascode connection and a negative-feedback circuit for achieving a desired gain. Japanese Unexamined Patent Publication (JP-A) No. 3-52407 (52407/1991) discloses an amplifier comprising bipolar transistors instead of the above-mentioned FET'S.

FIG. 1 shows a conventional negative-feedback amplifier circuit of the type. The negative-feedback amplifier circuit comprises a first-stage FET 1 and a second-stage FET 2 in so-called cascode connection, and a negative-feedback circuit 3 which couples a drain of the second-stage FET 2 to a gate of the first-stage FET 1 with a resistor Rf connected therebetween to adjust a gain. The negative-feedback amplifier circuit has an input terminal IN connected to the gate of the first-stage FET 1 and an output terminal OUT connected to the drain of the second-stage FET 2.

In the negative-feedback amplifier circuit illustrated In FIG. 1, however, the gain is adjusted or changed by selecting a resistance value of the resistor Rf. In this event, impedances of the input terminal IN and the output terminal OUT are also changed. This results in impedance mismatching with external circuits connected to the input terminal IN and the output terminal OUT. This is because the gain and the Impedances can not be controlled independently from each other.

SUMMARY OF THE INVENTION

It is therefore an object of this invention to provide a negative-feedback amplifier circuit capable of independently controlling a gain and an impedance.

Other objects of this invention will become clear as the description proceeds.

A negative-feedback amplifier circuit to which this invention is applicable is for amplifying an input electric signal into an output electric signal and comprises a plurality of active elements in cascode connection. The active elements include a first-stage active element and a final-stage active element each of which comprises an element input terminal, an element output terminal and an element control terminal. The element control terminal of the first-stage active element is supplied with the input electric signal. The element output terminal of the final-stage active element outputs the output electric signal. The negative-feedback amplifier circuit further comprises a first negative-feedback circuit connected between the element output terminal of the final-stage active element to the element control terminal of the first-stage active element and a second negative-feedback circuit connected between the element output terminal of the first-stage active element and the element control terminal of the first-stage active element.

A negative-feedback amplifier circuit to which this invention is also applicable is for amplifying an input electric signal into an output electric signal and comprises a plurality of FET's in cascode connection. The FET's include a first-stage FET and a final stage PET each of which comprises a source, a drain, and a gate. The gate of the first-stage FET is supplied with the input electric signal. The drain of the final-stage FET outputs the output electric signal. The negative-feedback amplifier circuit further comprises a first negative-feedback circuit connected between the drain of the final-stage PET and the gate of the first-stage FET and a second negative-feedback circuit connected between the drain of the first-stage FET and the gate of the first-stage FET.

A negative-feedback amplifier circuit to which this invention is also applicable is for amplifying an input electric signal into an output electric signal and comprises a plurality of bipolar transistors in cascode connection. The bipolar transistors include a first-stage bipolar transistor and a final stage bipolar transistor each of which comprises an emitter, a collector, and a base. The base of the first-stage bipolar transistor is supplied with the input electric signal, the collector of the final-stage bipolar transistor outputs the output electric signal. The negative-feedback amplifier circuit further comprises a first negative-feedback circuit connected between the collector of the final-stage bipolar transistor and the base of the first-stage bipolar transistor and a second negative-feedback circuit connected between the collector of the first-stage bipolar transistor and the base of the first-stage bipolar transistor.

DESCRIPTION OF THE PREFERRED EMBODIMENT

Figure 1:
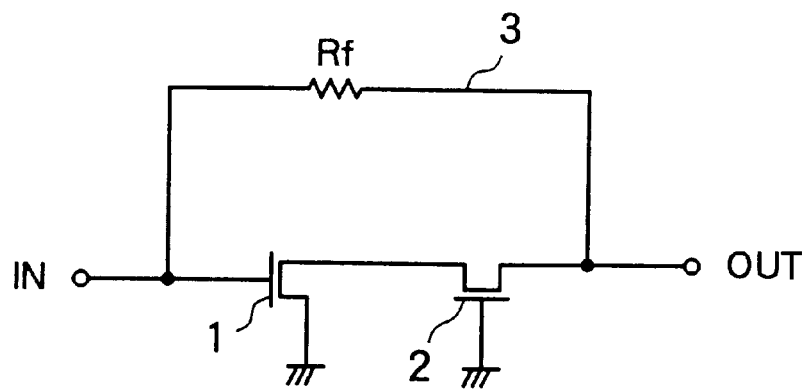
FIG. 1 is a circuit diagram of a conventional negative-feedback amplifier circuit.

Now, description will be made about this invention with reference to the drawing.

Figure 2:
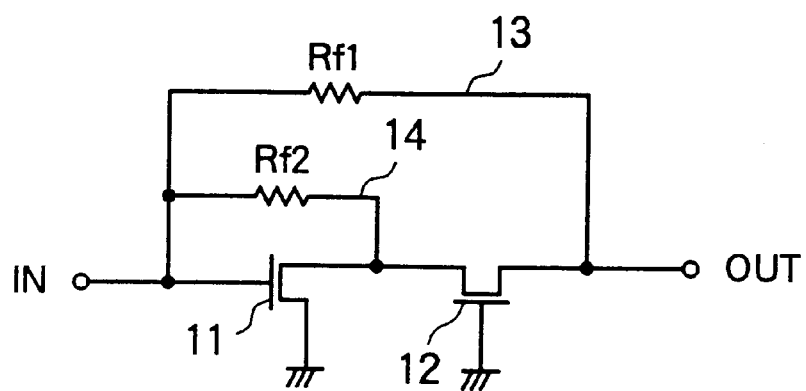
FIG. 2 is a circuit diagram of a negative-feedback amplifier circuit according to a first embodiment of this invention.

Referring to FIG. 2, description will be made about a negative-feedback amplifier circuit according to a first embodiment of this invention. The negative-feedback amplifier circuit is for amplifying an input electric signal into an output electric signal and comprises first-stage and final or second-stage field effect transistors (FET's) 11 and 12 as active elements. In the manner known in the art, each of the first-stage and the second stage FET's 11 and 12 comprises a gate, a source, and a drain which are referred to as an element control terminal, an element input terminal, and an element output terminal, respectively. The negative-feedback amplifier circuit has a circuit input terminal IN coupled to the gate of the first-stage PET 11 for suppling the input electric signal and a circuit output terminal OUT coupled to the drain of the second-stage FET 12 for outputting the output electric signal. The drain of the first-stage FET 11 is coupled to the source of the second-stage FET 12. Thus, the first-stage and the second-stage FET's 11 and 12 are coupled in so-called cascode connection known in the art.

The source of the first-stage FET 11 is coupled to ground. The gate of the second-stage FET 12 is coupled to ground.

The negative-feedback amplifier circuit further comprises a first negative-feedback circuit 13 coupling the drain of the second-stage FET 12 to the gate of the first-stage FET 11, and a second negative-feedback circuit 14 coupling the drain of the first-stage FET 11 to the gate of the first-stage FET 11. The first and the second negative-feedback circuits 13 and 14 comprise first and second resistors Rf1 and Rf2, respectively.

In the above-mentioned negative-feedback amplifier circuit, an output impedance can be adjusted by the first resistor Rf1. A gain can be adjusted by the first and the second resistors Rf1 and Rf2. Therefore, by adjusting the gain and the output impedance by the resistors Rf2 and Rf1, respectively, the gain and the output impedance can be independently controlled.

Figure 3:
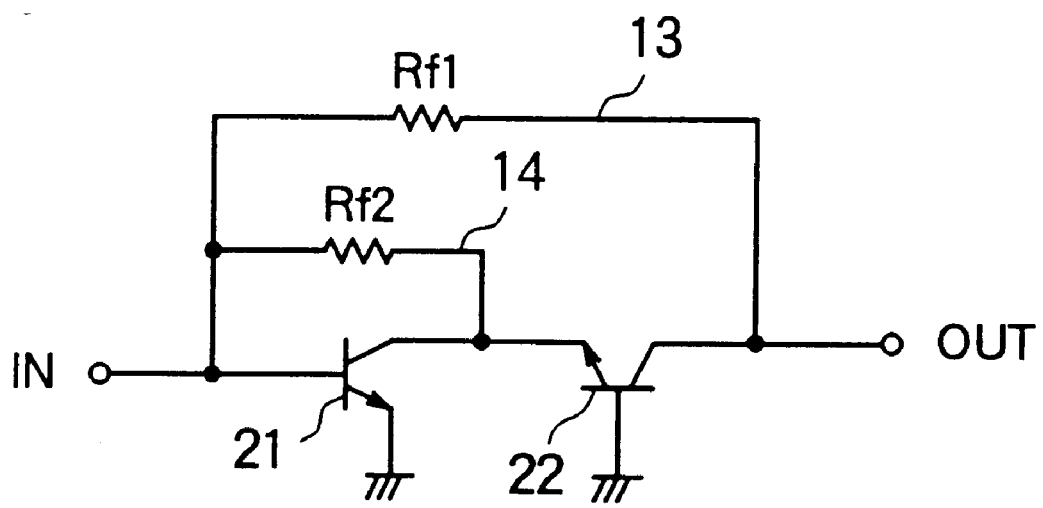
FIG. 3 is a circuit diagram of a negative-feedback amplifier circuit according to a second embodiment of this invention.

Referring to FIG. 3, the description will be directed to a negative-feedback amplifier circuit according to a second embodiment of this invention. Similar parts are designated by like reference numerals.

The negative-feedback amplifier circuit is for amplifying an input electric signal into an output electric signal and comprises first-stage and final or second-stage bipolar transistors 21 and 22 as the active elements in place of the FET's 11 and 12 illustrated in FIG. 2. In the manner known in the art, each of the first-stage and the second stage bipolar transistors 21 and 22 comprises a base, an emitter, and a collector which are referred to as the element control terminal, the element input terminal, and the element output terminal, respectively. In the negative-feedback amplifier circuit, the circuit input terminal IN is coupled to the base of the first-stage bipolar transistor 21, the circuit output terminal OUT being coupled to the emitter of the second-stage bipolar transistor 22, The collector of the first-stage bipolar transistor 21 is coupled to the emitter of the second-stage bipolar transistor 22. Thus, the first-stage and the second-stage stage bipolar transistors 21 and 22 are coupled in so-called called cacoade connection known in the art.

The emitter of the first-stage bipolar transistor 21 is coupled to ground. The base of the second-stage bipolar transistor 22 is coupled to ground.

In the negative-feedback amplifier circuit, the first negative-feedback circuit 13 couples the collector of the second-stage bipolar transistor 22 to the base of the first-stage bipolar transistor 21. The second negative-feedback circuit 14 couples the collector of the first-stage bipolar transistor 21 to the base of the first-stage bipolar transistor 21. The first and second resistors Rf1 and Rf2 are connected to the first and the second negative-feedback circuits 13 and 14, respectively.

In the above-mentioned negative-feedback amplifier circuit, the output impedance can be adjusted by the first resistor Rf1. The gain can be adjusted by the first and the second resistors Rf1 and Rf2. Therefore, by adjusting the gain and the output impedance by the resistors Rf2 and Rf1, respectively, the gain and the output impedance can be independently controlled.

Thus, it is possible to independently control the gain and the output impedance. Therefore, each of the negative-feedback amplifier circuits described above is capable of adjusting the gain without causing impedance mismatching.

Each of the above-mentioned negative-feedback amplifier circuits is adapted for use in a wide-band amplifier required in a CATV or the like to cope with an increase in number of channels.

While this invention has thus far been described in conjunction with a few embodiments thereof, it will readily be possible for those skilled in the art to put this invention into practice in various other manner. For example, although the foregoing description is directed to the case where the two active elements are used, it will be understood that this invention is also applicable to the case where three or more active elements are coupled in cascode connection in the manner known in the art.

What is claimed is:

1. A negative-feedback amplifier circuit for amplifying an input electric signal into an output electric signal, comprising:

a plurality of active elements in cascode connection, said active elements including a first-stage active element and a final-stage active element each of which comprises an element input terminal, an element output terminal, and an element control terminal, said element control terminal of the first-stage active element being supplied with said input electric signal, said element output terminal of the final-stage active element outputting said output electric signal;

a first negative-feedback circuit connected between said element output terminal of the final-stage active element and said element control terminal of the first-stage active element, said first negative-feedback circuit including a means for adjusting an output impedance of said negative-feedback amplifier circuit; and a second negative-feedback circuit connected between said element output terminal of the first-stage active element and said element control terminal of the first-stage active element, wherein said first negative-feedback circuit returns negative feedback to said element control terminal of the first-stage active element without limiting said negative feedback to a predetermined range of frequencies.

2. A negative-feedback amplifier circuit for amplifying an input electric signal into an output electric signal, comprising:

a plurality of FETs in cascode connection, said FETs including a first-stage FET and final stage FET each of which comprises a source, a drain, and a gate, said gate of the first-stage FET being supplied with said input electric signal, said drain o fth final-stage FET outputting said output electric signal;

a first negative-feedback circuit connected between said drain of the final-stage FET and said gate of the first-stage FET, said first negative-feedback circuit including a means for adjusting an output impedance of said negative-feedback amplifier circuit; and a second negative-feedback circuit connected between said drain of the first-stage FET and said gate of the first-stage FET, wherein said first negative-feedback circuit returns negative feedback to said element control terminal of the first-stage active element without limiting said negative feedback to a predetermined range of frequencies.

3. A negative-feedback amplifier circuit for amplifying an input electric signal into an output electric signal, comprising:

a plurality of bipolar transistors in cascode connection, said bipolar transistors including a first-stage bipolar transistor and a final stage bipolar transistor each of which comprises an emitter, a collector, and a base, said base of the first-stage bipolar transistor being supplied with said input electric signal, said collector of the final-stage bipolar transistor outputting said output electric signal;

a first negative-feedback circuit connected between said collector of the final-sage bipolar transistor and said base of the first-stage bipolar transistor, said first negative-feedback circuit including a means for adjusting an output impedance of said negative-feedback amplifier circuit; and a second negative-feedback circuit connected between said collector of the first-stage bipolar transistor and the base of the first-stage bipolar transistor, wherein said first negative-feedback circuit returns negative feedback to said element control terminal of the first-stage active element without limiting said negative feedback to a predetermined range of frequencies.

4. A negative-feedback amplifier circuit as claimed in claim 1, wherein said means includes a first resistor having a value which determines the output impedance of said negative-feedback amplifier circuit.

5. A negative-feedback amplifier circuit as claimed in claim 2, wherein said first negative-feedback circuit comprises a first resistor for adjusting an output impedance, said second negative-feedback circuit comprising a second resistor for adjusting a gain in cooperation with said first resistor.

6. A negative-feedback amplifier circuit as claimed in claim 3, wherein said first negative-feedback circuit comprises a first resistor for adjusting an output impedance, said second negative-feedback circuit comprising a second resistor for adjusting a gain in cooperation with said first resistor.

7. A negative-feedback amplifier circuit as claimed in any one of claims 4–6, wherein said second negative-feedback circuit includes a second resistor for adjusting a gain in cooperation with said first resistor.

8. A negative-feedback amplifier circuit as claimed in claim 2, wherein said means includes a first resistor having a value which determines the output impedance of said negative-feedback amplifier circuit.

9. A negative-feedback amplifier circuit as claimed in claim 3, wherein said means includes a first resistor having a value which determines the output impedance of said negative-feedback amplifier circuit.

* * * * *